United States Patent
Nam et al.

(10) Patent No.: US 12,057,178 B2
(45) Date of Patent: Aug. 6, 2024

(54) CELL VOLTAGE DROP COMPENSATION CIRCUIT

(71) Applicant: Micron Technology, Inc., Boise, ID (US)

(72) Inventors: Kijun Nam, Plano, TX (US); Mingdong Cui, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 17/831,266

(22) Filed: Jun. 2, 2022

(65) Prior Publication Data

US 2023/0395164 A1   Dec. 7, 2023

(51) Int. Cl.
| | | |
|---|---|---|
| G11C 5/14 | (2006.01) | |
| G11C 16/12 | (2006.01) | |
| G11C 16/26 | (2006.01) | |
| G11C 16/30 | (2006.01) | |
| G11C 16/34 | (2006.01) | |

(52) U.S. Cl.
CPC ............. *G11C 16/30* (2013.01); *G11C 5/14* (2013.01); *G11C 16/12* (2013.01); *G11C 16/26* (2013.01); *G11C 16/3418* (2013.01)

(58) Field of Classification Search
CPC .......... G11C 16/30; G11C 5/14; G11C 5/147; G11C 16/12; G11C 16/26; G11C 16/3418
See application file for complete search history.

(56) References Cited

U.S. PATENT DOCUMENTS

| | | | | |
|---|---|---|---|---|
| 2013/0028014 A1* | 1/2013 | Guo | ......................... | G11C 7/14 |
| | | | | 365/163 |
| 2014/0003164 A1* | 1/2014 | Fifield | ................. | G11C 11/4085 |
| | | | | 307/53 |
| 2017/0288542 A1* | 10/2017 | Wan | ........................ | G05F 1/59 |
| 2018/0108407 A1* | 4/2018 | Ham | ................... | G11C 13/004 |
| 2022/0028453 A1* | 1/2022 | Yuh | ..................... | G11C 13/0038 |
| 2022/0093204 A1* | 3/2022 | Chaudhry | ............. | G11C 29/44 |

* cited by examiner

*Primary Examiner* — Mushfique Siddique
(74) *Attorney, Agent, or Firm* — Greenberg Traurig

(57) ABSTRACT

In some aspects, the techniques described herein relate to a circuit including: a memory cell; a source follower, a source terminal of the source follower communicatively coupled to the memory cell; a voltage source; an operational amplifier, a non-inverting input of the operational amplifier communicatively coupled to the voltage source; and a replica source follower, a gate of the replica source follower communicatively coupled to an output of the operational amplifier and a source terminal of the replica source follower communicatively coupled to an inverting input of the operational amplifier via a feedback loop.

18 Claims, 5 Drawing Sheets

CELL VOLTAGE DROP COMPENSATION CIRCUIT

FIELD OF THE TECHNOLOGY

At least some embodiments disclosed herein relate generally to semiconductor devices and, in particular, to improving secure communications using Flash memory devices.

BACKGROUND

Memory devices include memory cells that require certain voltages for operation. Many circuit elements cause voltage drops, resulting in lowered input voltages to active memory elements. Such voltage drops may be variable in nature (e.g., caused due to temperature factors). The failure to provide a stable voltage to memory elements can result in unpredictability or damage to the memory cell.

DETAILED DESCRIPTION

Figure 1:
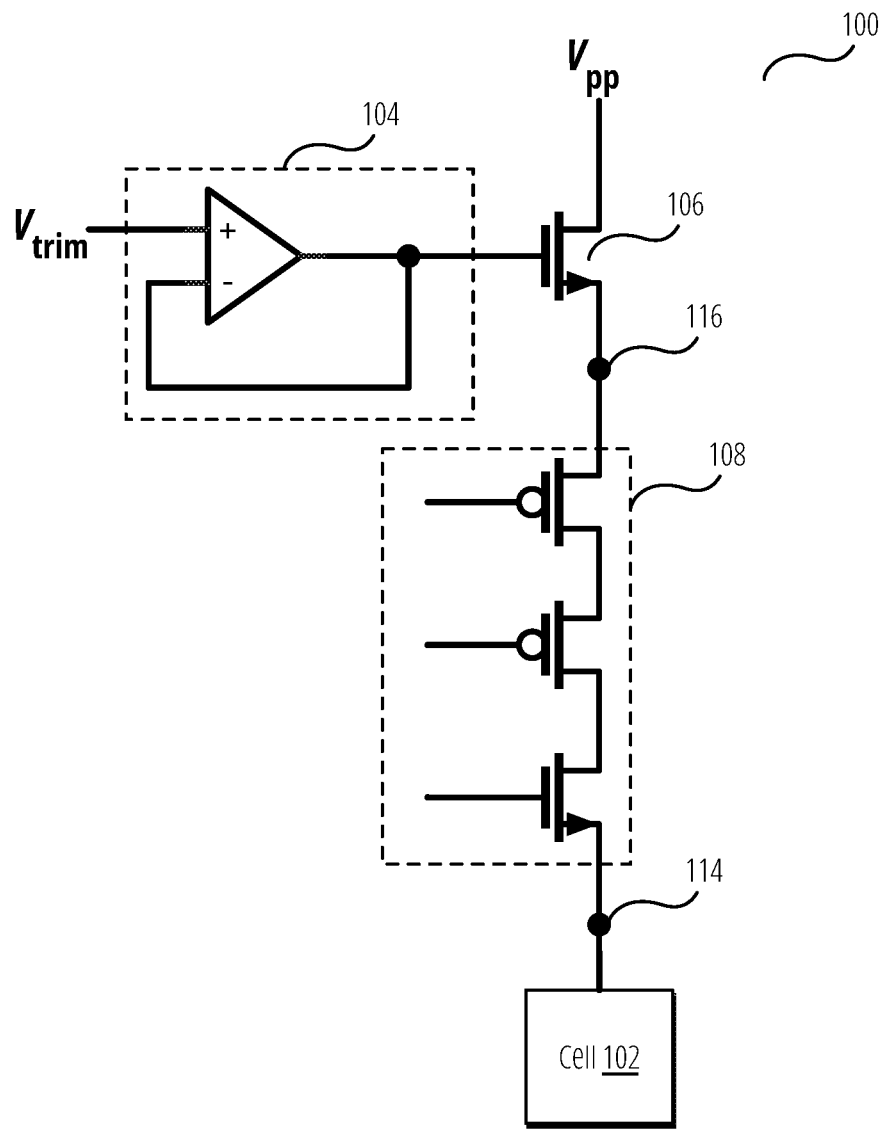
FIG. 1 is a circuit diagram illustrating a supply-side circuit according to some of the example embodiments.

The example embodiments regulate an input voltage to a memory cell and compensate for variations in input voltages caused by dynamic factors (e.g., temperature, process changes, etc.). The example embodiments utilize a replica of circuitry contributing to a voltage drop and an operational amplifier that increases the input voltage to the corresponding circuity to ensure that the received input voltage to the memory device matches the provided input voltage.

In some aspects, the techniques described herein relate to a circuit including: a memory cell; a source follower, a source terminal of the source follower communicatively coupled to the memory cell; a voltage source; an operational amplifier, a non-inverting input of the operational amplifier communicatively coupled to the voltage source; and a replica source follower, a gate of the replica source follower communicatively coupled to an output of the operational amplifier and a source terminal of the replica source follower communicatively coupled to an inverting input of the operational amplifier via a feedback loop.

In some aspects, the techniques described herein relate to a circuit, wherein a drain terminal of the replica source follower and a drain terminal of the source follower are communicatively coupled to a fixed voltage source.

In some aspects, the techniques described herein relate to a circuit, further including a current source communicatively coupled to the feedback loop.

In some aspects, the techniques described herein relate to a circuit, wherein a replica control circuit is situated between the source terminal of the replica source follower and the feedback loop.

In some aspects, the techniques described herein relate to a circuit, wherein the replica control circuit is identical to a control circuit situated between the source follower and the memory cell.

In some aspects, the techniques described herein relate to a circuit, wherein the replica control circuit includes a plurality of active circuit elements.

In some aspects, the techniques described herein relate to a circuit, wherein the replica control circuit includes at least one element contributing a voltage drop.

In some aspects, the techniques described herein relate to a circuit, wherein the output of the operational amplifier is further communicatively coupled to the source follower.

In some aspects, the techniques described herein relate to a circuit including: a first voltage regulator, the first voltage regulator generating a first voltage; a second voltage regulator, the second voltage regulator generating a second voltage, the second voltage including an adjusted voltage determining by sampling one or more voltage drops across one or more circuit elements; and a switching mechanism, the switching mechanism capable of programmatically selecting between supplying the first voltage and the second voltage to a positive side of a memory cell.

In some aspects, the techniques described herein relate to a circuit, wherein the second voltage regulator includes an operational amplifier and a replica source follower, wherein an inverting terminal of the operational amplifier is communicatively coupled to a source terminal of the source follower.

In some aspects, the techniques described herein relate to a circuit, further including a monitoring circuit configured to receive the adjusted voltage and output the adjusted voltage in response to a control signal.

In some aspects, the techniques described herein relate to a circuit, wherein the switching mechanism is programmatically controlled.

In some aspects, the techniques described herein relate to a circuit, further including a third voltage regulator and a fourth voltage regulator, the third voltage regulator generating a third voltage output, and the fourth voltage regulator generating a fourth adjusted voltage, wherein the third voltage regulator and the fourth voltage regulator are communicatively coupled to a negative side of the memory cell.

In some aspects, the techniques described herein relate to a circuit, wherein the switching mechanism is further configured to select between the third voltage regulator and the fourth voltage regulator.

In some aspects, the techniques described herein relate to a method including: sampling voltage drops across one or more circuit elements; adjusting a target voltage based on the voltage drops to obtain an adjusted target voltage; and supplying the adjusted target voltage to a memory cell.

In some aspects, the techniques described herein relate to a method, wherein sampling voltage drops across one or more circuit elements includes sampling a voltage drop of a replica source follower by hardwiring a source terminal of the replica source follower to an inverting input of an operational amplifier.

In some aspects, the techniques described herein relate to a method, wherein the target voltage includes a voltage applied to a non-inverting input of the operational amplifier.

In some aspects, the techniques described herein relate to a method, wherein adjusting the target voltage based on the voltage drops includes increasing an output voltage of the operational amplifier.

In some aspects, the techniques described herein relate to a method, wherein sampling voltage drops across one or more circuit elements includes sampling a voltage drop of a replica source follower and one or more replica control circuit elements by hardwiring a terminal a final circuit element in the one or more replica control circuit elements to an inverting input of an operational amplifier.

In some aspects, the techniques described herein relate to a method, wherein supplying an adjusted target voltage to a memory element based on the sampling includes supplying the adjusted target voltage to the memory element in response to a control signal.

FIG. 1 is a circuit diagram illustrating a supply-side circuit according to some of the example embodiments.

In an embodiment, the circuit 100 provides an input voltage 114 to a memory cell 102. In some embodiments, the input voltage 114 is used during read and write operations involving the memory cell 102. In some embodiments, the memory cell 102 can comprise a single-level cell (SLC) NAND Flash memory cell (e.g., a floating gate transistor). In other embodiments, the memory cell 102 can comprise a multi-level cell (MLC) or triple-level cell (TLC) NAND Flash memory cell. In a typical memory, the memory may include many such cells and thus many such supply-side circuits. Only one is illustrated for the sake of clarity.

In some embodiments, the memory cell 102 can comprise a chalcogenide-based memory cell that is arranged with other such memory cells in a three-dimensional (3D) architecture, such as a cross-point architecture, or arranged in a three-dimensional (3D) vertical architecture. Cross-point memory (e.g., 3D XPoint memory) uses an array of non-volatile memory cells. The memory cells in cross-point memory are transistor-less. Each of such memory cells can have a selector device and optionally a phase-change memory device that are stacked together as a column in an integrated circuit. Memory cells of such columns are connected in the integrated circuit via two layers of wires running in directions that are perpendicular to each other. One of the two layers is above the memory cells; and the other layer is below the memory cells. Thus, each memory cell can be individually selected at a cross point of two wires running in different directions in two layers. Cross point memory devices are fast and non-volatile and can be used as a unified memory pool for processing and storage.

In some implementations, the cross point memory uses a memory cell that has an element (e.g., a sole element) acting both as a selector device and a memory device. For example, the memory cell can use a single piece of alloy with variable threshold capability. The read/write operations of such a memory cell can be based on thresholding the memory cell while inhibiting other cells in sub-threshold bias, in a way similar to the read/write operations for a memory cell having a first element acting as a selector device and a second element acting as a phase-change memory device that are stacked together as a column. A selector device usable to store information can be referred to as a selector/memory device.

Such a self-selecting memory cell, having a selector/memory device, can be programmed in cross point memory to have a threshold voltage window. The threshold voltage window can be created by applying programming pulses with opposite polarity to the selector/memory device. For example, the memory cell can be biased to have a positive voltage difference between two sides of the selector/memory device and alternatively, or to have a negative voltage difference between the same two sides of the selector/memory device. When the positive voltage difference is considered in positive polarity, the negative voltage difference is considered in negative polarity that is opposite to the positive polarity. Reading can be performed with a given/fixed polarity. When programmed, the memory cell has a low threshold (e.g., lower than the cell that has been reset, or a cell that has been programmed to have a high threshold), such that during a read operation, the read voltage can cause a programmed cell to snap and thus become conductive while a reset cell remains non-conductive.

In the illustrated embodiment, a trim voltage ($V_{trim}$) is supplied to an operational amplifier 104 which supplies a constant trim voltage to the gate of a source follower 106. The source follower 106 includes a threshold voltage ($v_{th}$). Theoretically, the source follower output voltage 116 ($v_{out}$) of the source follower 106 should be equal to the input voltage $V_{trim}$, however source followers will generally experience variable voltage drops due to factors such as temperature, process defects, etc. Thus, the source follower output voltage 116 is equal to $V_{trim}-v_{d1}(t)$, where $v_{d1}(t)$ represents the voltage drop across source follower 106 as a function of process corner and temperature. The value of $V_{trim}$ may be variable, but is generally constant.

The circuit 100 additionally includes control circuitry 108 between source follower 106 and the memory cell 102. The specific elements in control circuitry 108 are not limiting. As illustrated, the control circuitry 108 can include one or more transistor elements that form a decoder to selecting the memory cell 102 during read and write operations. Each element of control circuitry 108 can introduce additional voltage drops (similar to that described with respect to source follower 106). For example, each transistor in control circuitry 108 can introduce its own voltage drop. In some embodiments, the voltage drop of control circuitry 108 can be represented as $$v_{dcir} = \sum_{i}^{n} v_{di} \qquad \text{Equation 1}$$

In Equation 1, $v_{di}$ represents the voltage drop for the i-th circuit element in control circuitry 108. Using the above drops, the voltage at input voltage 114 ($V_{cell}$) can be computed as $V_{cell}=V_{trim}-v_{d1}-v_{dcir}$. Frequently, in current systems, to ensure a reasonably certain value of $V_{cell}$, a target value of $V_{trim}$ will be determined based on analysis of source follower 106 and control circuitry 108. For example, if the target $V_{cell}$ is 3V and the values of $v_{d1}$ and $v_{dcir}$ are determined (experimentally) as 800.0 mV and 200.0 mV, respectively. The target value of $V_{trim}$ can be computed as $V_{trim}=V_{cell}+v_{d1}+v_{dcir}=(3+0.8+0.2)V=4V$. Thus, $V_{trim}$ can be set to 4V to obtain a $V_{cell}$ value of 3V.

However, such an approach may not always provide a reliable value of $V_{cell}$. For example, the voltage drop across source follower 106 is generally not constant at different temperatures or when using different fabrication processes. Further, even if the voltage output by source follower 106 is constant regardless of temperature and fabrication process, a change in the bias voltage ($V_{dd}$) can change the resulting output. Further, using different levels as a body bias can also change the voltage drop across source follower 106. Finally, similar types of unpredictability can be found in control circuitry 108 while different configurations of control circuitry 108 can introduce differing drops.

Figure 2:
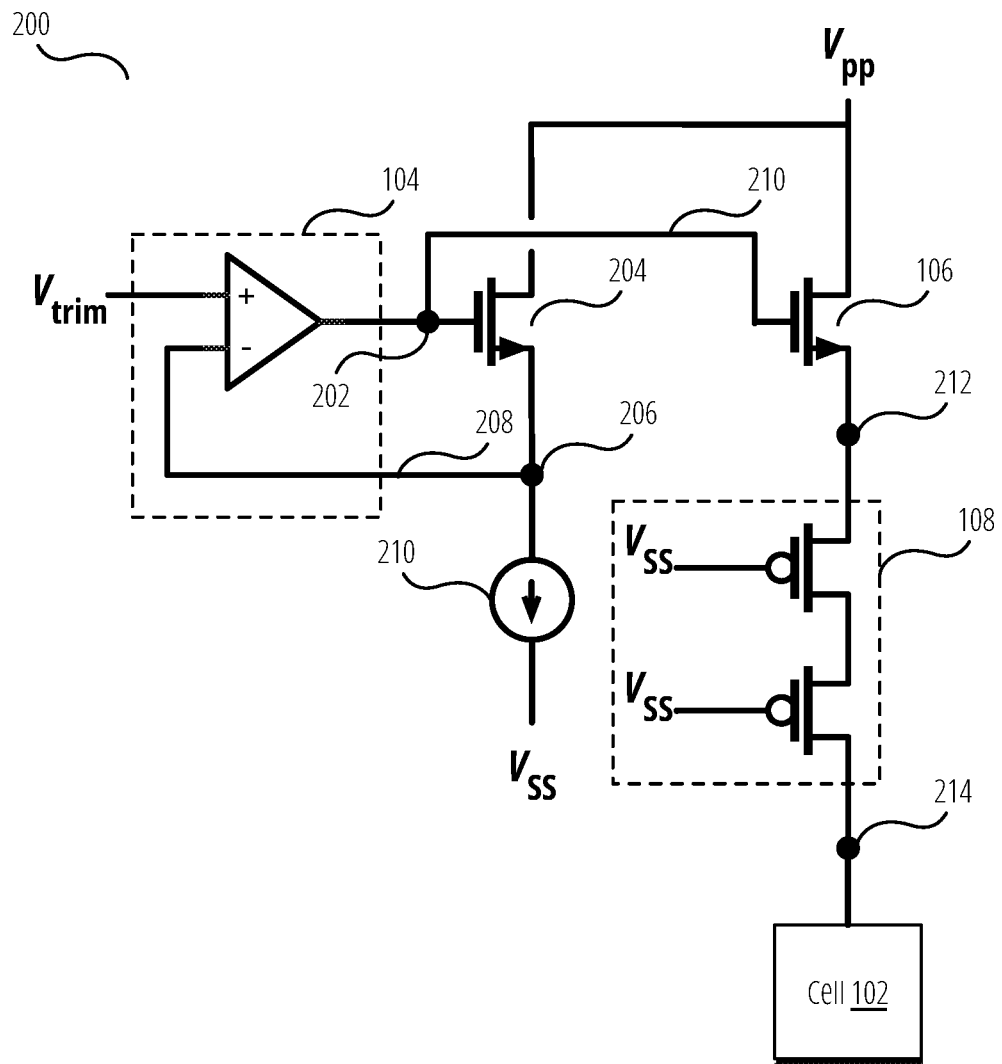
FIG. 2 is a circuit diagram illustrating a supply-side circuit with voltage drop compensation according to some of the example embodiments.

FIG. 2 is a circuit diagram illustrating a supply-side circuit with voltage drop compensation according to some of the example embodiments. Various elements of FIG. 2 bearing the same reference numerals as that of FIG. 1 are depicted and those descriptions are not repeated herein. Instead, the following description describes the change to the circuit 100 of FIG. 1.

As illustrated, the output voltage 202 of operational amplifier 104 is fed both into source follower 106 and a replica source follower 204. In an embodiment, the replica source follower 204 and source follower 106 may be functionally and structurally identical.

In an embodiment, a current source 210 is connected to the output of the source follower output voltage 206 to bias the source follower output voltage 206. In some embodiments, the current source 210 can comprise a current mirror. In some embodiments, the current source 210 can be used to compensate the voltage drop across the source follower output voltage 206. In some embodiments, the current source 210 can comprise a 2-5 uA current source.

As illustrated, the inverting input of operational amplifier 104 is communicatively coupled to the source of the replica source follower 204 via feedback loop 208. Due to the voltage drop of replica source follower 204 and the compensation by current source 210 the operational amplifier 104 will adjust its output to minimize the differential between its inverting and non-inverting input. As such, the output voltage 202 will be adjusted such that source follower output voltage 206 is maintained at the desired $V_{trim}$.

In an embodiment, the output voltage 202 is additionally coupled to the gate of source follower 106. In contrast to FIG. 1, the output voltage 202 will be higher than $V_{trim}$ due to the amplification of operational amplifier 104. As such, the resulting source follower output voltage 212 will be substantially equal to $V_{trim}$. Consequently, the cell voltage 214 will also be closed to $V_{trim}$, subject to any residual losses attributable to control circuitry 108. More formally, the output voltage 202 will be $V_{trim}+v_{th}$, where $v_{th}$ is the threshold voltage of replica source follower 204.

Thus, in circuit 200, the trim voltage provided to source follower 106 is dynamically adjusted based on the actual loss of a replicate source follower (replica source follower 204). In this manner, the replica can be used to simulate the voltage drop that source follower 106 will experience. The use of source follower output voltage 206 and feedback loop 208 allows for adjustments of the output voltage 202 of operational amplifier 104 to provide an amplified voltage to the source follower 106 to compensate for the internal voltage drop of source follower 106. The circuit 200 provides for a close approximation of $V_{trim}$ at cell voltage 214 which may be suitable for most applications. However, as will be discussed next, circuit 200 can be further refined to most closely replicate the underlying control circuitry and further increase the voltage drop compensation.

Figure 3:
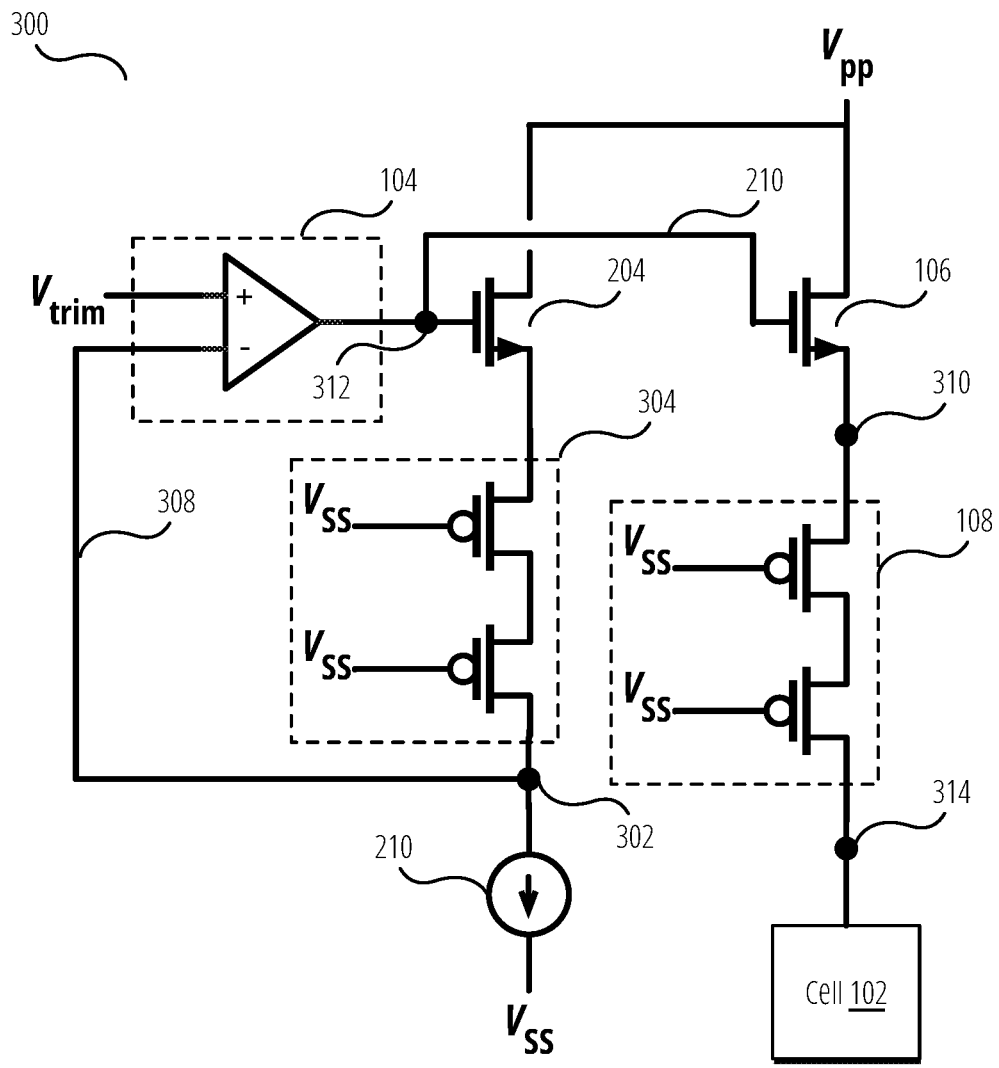
FIG. 3 is a circuit diagram illustrating a supply-side circuit with voltage drop compensation according to some of the example embodiments.

FIG. 3 is a circuit diagram illustrating a supply-side circuit with voltage drop compensation according to some of the example embodiments. Various elements of FIG. 3 bearing the same reference numerals as that of FIGS. 1 and 2 are depicted and those descriptions are not repeated herein. Instead, the following description describes the changes to the circuit 100 of FIG. 1 and circuit 200 of FIG. 2.

Unlike FIG. 2, circuit 300 includes replica control circuitry 304 wired to replica source follower 204. As illustrated, the replica control circuitry 304 is connected to the source terminal of the replica source follower 204. in an embodiment, the replica control circuitry 304 is identical to that of control circuitry 108. That is, the replica control circuitry 304 is explicitly designed to mirror the required circuitry situated between source follower 106 and memory cell 102.

Due to replica control circuitry 304, the dropped voltage 302 is attributable to both the $v_{th}$ with drop across replica source follower 204 as well as the IR drop ($v_{dcir}$) across replica control circuitry 304. This dropped voltage 302 is then used as the inverted input of operational amplifier 104 (via feedback loop 308) which causes the output voltage 312 of the operational amplifier 104 to rise corresponding to minimize the differential between $V_{trim}$ and dropped voltage 302.

As in FIG. 2, the output voltage 312 ($V_{trim}+v_{th}+v_{dcir}$) is used as the gate voltage to source follower 106. Thus, the output voltage 310 of source follower 106 will be equal to $V_{sfout}=V_{trim}+v_{th}+v_{dcir}-v_{th}=V_{trim}+v_{dcir}$. Further, the cell voltage 314 at memory cell 102 will be equal to $V_{sfout}-v_{dcir}=V_{trim}+v_{dcir}-v_{dcir}=V_{trim}$. Thus, the circuit 300 can ensure that the cell voltage 314 remains equal to $V_{trim}$ regardless of operating changes in the voltage drops due to, for example, process changes, temperature etc. Moreover, any type of active or passive elements in control circuitry 108 can be replicated in replica control circuitry 304, thus exactly mirroring the elements situated before memory cell 102.

Figure 4:
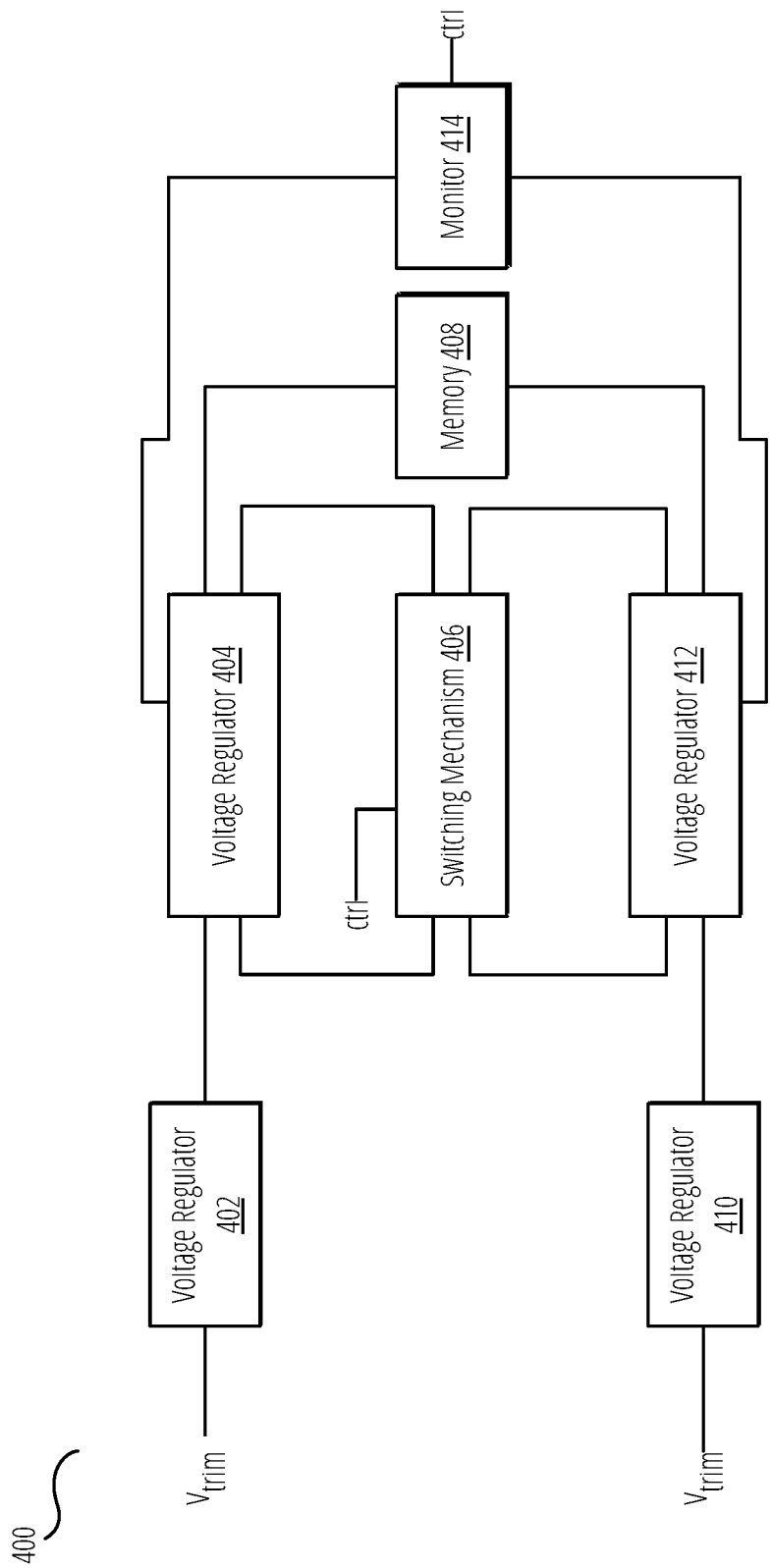
FIG. 4 is a circuit diagram of top and bottom control circuity to compensate for voltage drops in a memory device according to some of the example embodiments.

FIG. 4 is a circuit diagram of top and bottom control circuity to compensate for voltage drops in a memory device according to some of the example embodiments.

In an embodiment, circuit 400 includes a first voltage regulator 402. In an embodiment, the first voltage regulator 402 receives, as an input, a target voltage ($V_{trim}$). In some embodiments, the first voltage regulator 402 can comprise an operational amplifier. In some embodiments, the target voltage can be applied to the non-inverting terminal of the operational amplifier. In some embodiments, the operational amplifier can be supplied with a positive voltage (referred to as a pump voltage). In some embodiments, the output of the operational amplifier can be connected to the gate of a PMOS transistor, the source terminal of the PMOS transistor connected to the pump voltage and the drain terminal comprising the output of the first voltage regulator 402.

The voltage output from the drain terminal of the PMOS transistor in the first voltage regulator 402 is input into the second voltage regulator 404. In some embodiments, the voltage output from the drain terminal of the PMOS transistor in the first voltage regulator 402 is supplied to the inverting input of an operational amplifier. In some embodiments, the operational amplifier can be supplied with a positive voltage (referred to as a pump voltage). In some embodiments, the output of the operational amplifier of second voltage regulator 404 is supplied to the gate of a PMOS transistor, the source terminal of the PMOS transistor connected to the pump voltage. In some embodiments the drain of the PMOS transistor can be connected in parallel to a current source (connected to ground) and the gate of an NMOS transistor. In some embodiments, the drain of the NMOS transistor can be connected to a positive voltage source ($V_{pp}$) while the source is connected to a current source (e.g., current mirror), as depicted in FIG. 2.

In some embodiments, the second voltage regulator 404 can take a second input from a switching mechanism 406. In some embodiments, the switching mechanism 406 can receive the voltage from the drain terminal of the PMOS transistor of second voltage regulator 404 and the voltage from the source terminal of the NMOS transistor as inputs.

The switching mechanism 406 can include a two-input CMOS multiplexer that is controlled by a signal from a register file or other storage device. Thus, the register can selectively toggle between the two voltages and the selected voltage can be use as the non-inverting input of the operation amplifier of second voltage regulator 404. Ultimately, the voltage at the source terminal of the NMOS transistor of second voltage regulator 404 can be used as the input voltage to memory 408. Further, this voltage can be fed to a monitor circuit 414 circuit. In some embodiments, the monitor circuit 414 can comprise a CMOS switch that is controlled by a second signal. This monitor circuit 414 can output the currently supplied voltage to the memory 408 for analysis.

In an embodiment, the circuit 400 includes a bottom side circuit operating similar to first voltage regulator 402 and second voltage regulator 404 to supply a corresponding low voltage to memory 408. In an embodiment, a target voltage ($V_{trim}$) is applied to a third voltage regulator 410 and the third voltage regulator 410 outputs a voltage to fourth voltage regulator 412. In an embodiment, the fourth voltage regulator 412 can include an operational amplifier that receives, at its non-inverting terminal, a variable voltage source and outputs its voltage to an NMOS transistor gate. In some embodiments, the NMOS transistor can receive a positive voltage at its drain terminal and can connect to a negative or ground terminal at its source. In some embodiments, the drain of the NMOS transistor can also be connected to a PMOS transistor gate, the PMOS transistor's source terminal connected to the output terminal of the memory 408 and the monitor circuit 414. In some embodiments, the switching mechanism 406 can be configured to toggle select the input to the inverting terminal of the operation amplifier of fourth voltage regulator 412. For example, the switching mechanism 406 can switch between the voltage output by the memory 408 and the output generated by fourth voltage regulator 412 in response to the same control signal discussed previously. In general, third voltage regulator 410 and fourth voltage regulator 412 are complementary to the circuitry in first voltage regulator 402 and second voltage regulator 404 and specific details are not included for the sake of clarity.

Figure 5:
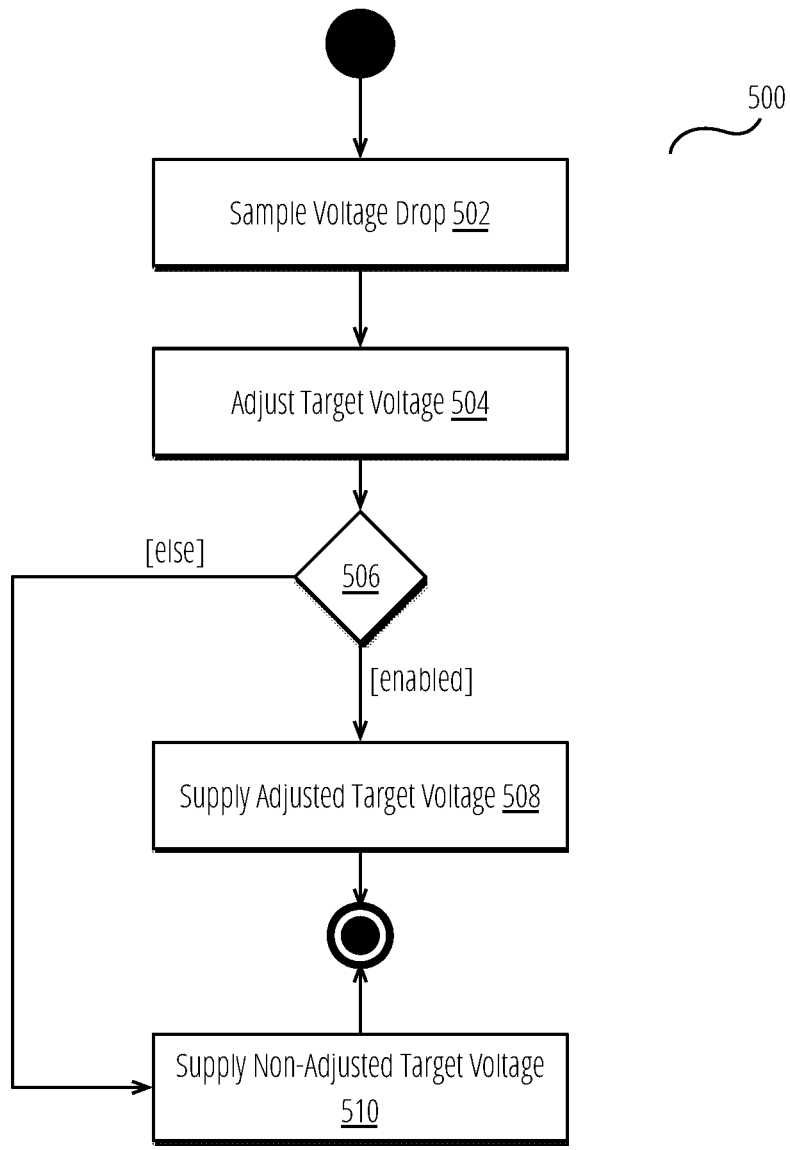
FIG. 5 is a flow diagram illustrating a method for compensating voltage drops in a memory device according to some of the example embodiments.

FIG. 5 is a flow diagram illustrating a method for compensating voltage drops in a memory device according to some of the example embodiments. Method 500 can be performed by the circuits of FIG. 2, 3, or 4.

In step 502, method 500 can include sampling a voltage drop across one or more circuit elements. With reference to FIG. 2, these circuit elements can include a replica source follower and, in some embodiments, a replica control circuit. In some embodiments, sampling can be performed by hardwiring the output of one of the one or more circuit elements to an operation amplifier. In some embodiments, sampling can be performed by hardwiring the output of one of the one or more circuit elements to an inverting input of the operation amplifier. In some embodiments, the hardwired circuit element can comprise a replica source follower. In some embodiments, the source terminal of the replica source follower can be hardwired to the inverting input of the operational amplifier. In other embodiments, the hardwired circuit element can be the final circuit element in a series of circuit elements in the replica control circuit. In some embodiments, this final circuit elements output (e.g., a drain of a PMOS transistor) can be hardwired to the inverting input of the operational amplifier.

In step 504, method 500 can include adjusting a target voltage based on the sampled voltage drop. In some embodiments, an operational amplifier can receive a target voltage from a fixed voltage source (e.g., $V_{trim}$). As discussed above, the inverting input can comprise the value of $V_{trim}$ less one or more voltage drops. The operational amplifier will increase its output voltage (the target voltage) to compensate for the differential between its input, thus reaching a target voltage.

In step 506, method 500 can include determining if voltage drop compensation is enabled. In some embodiments, a register or other storage element can provide a control signal to a switching element which can toggle between different voltage sources. In some embodiments, this switching element can vary the supplied voltage to a memory circuit. In some embodiments, if method 500 determines that the adjusted target voltage should be used, the voltage as adjusted in step 504 can be applied to the memory circuit (step 508). Alternatively, if method 500 determines that the non-adjusted voltage should be used, the non-adjusted voltage can be supplied (step 510). Details of such switching are provided in FIG. 4.

The description and drawings are illustrative and are not to be construed as limiting. Numerous specific details are described to provide a thorough understanding. However, in certain instances, well-known or conventional details are not described in order to avoid obscuring the description. References to "one" or "an" embodiment in the present disclosure do not necessarily reference the same embodiment and such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described, which may be requirements for some embodiments, but not other embodiments.

Although some of the drawings illustrate a number of operations in a particular order, operations which are not order-dependent may be reordered, and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software, or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

The invention claimed is:

1. A circuit comprising:
   a memory cell;
   control circuitry communicatively coupled to the memory cell;
   a source follower, a source terminal of the source follower communicatively coupled to the control circuitry;
   a voltage source;

an operational amplifier, a non-inverting input of the operational amplifier communicatively coupled to the voltage source;
a replica source follower, a gate of the replica source follower communicatively coupled to an output of the operational amplifier and a source terminal of the replica source follower communicatively coupled to an inverting input of the operational amplifier via a feedback loop, the feedback loop including replica control circuitry; and
a current source communicatively coupled to an output of the replica control circuitry.

2. The circuit of claim 1, wherein a drain terminal of the replica source follower and a drain terminal of the source follower are communicatively coupled to a fixed voltage source.

3. The circuit of claim 1, wherein the replica control circuit is identical to a control circuit situated between the source follower and the memory cell.

4. The circuit of claim 1, wherein the replica control circuit includes a plurality of active circuit elements.

5. The circuit of claim 1, wherein the replica control circuit includes at least one element contributing a voltage drop.

6. The circuit of claim 1, wherein the output of the operational amplifier is further communicatively coupled to the source follower.

7. A circuit comprising:
a first voltage regulator, the first voltage regulator generating a first voltage;
a second voltage regulator, the second voltage regulator generating a second voltage, the second voltage comprising an adjusted voltage determining by sampling one or more voltage drops across one or more circuit elements; and
a switching mechanism, the switching mechanism capable of programmatically selecting between supplying the first voltage and the second voltage to a memory cell.

8. The circuit of claim 7, wherein the second voltage regulator comprises an operational amplifier and a replica source follower, wherein an inverting terminal of the operational amplifier is communicatively coupled to a source terminal of the source follower.

9. The circuit of claim 7, further comprising a monitoring circuit configured to receive the adjusted voltage and output the adjusted voltage in response to a control signal.

10. The circuit of claim 7, wherein the switching mechanism is programmatically controlled.

11. The circuit of claim 7, further comprising a third voltage regulator and a fourth voltage regulator, the third voltage regulator generating a third voltage output, and the fourth voltage regulator generating a fourth adjusted voltage, wherein the third voltage regulator and the fourth voltage regulator are communicatively coupled to a negative side of the memory cell.

12. The circuit of claim 11, wherein the switching mechanism is further configured to select between the third voltage regulator and the fourth voltage regulator.

13. A method comprising:
sampling voltage drops across one or more circuit elements;
adjusting a target voltage based on the voltage drops to obtain an adjusted target voltage; and
supplying the adjusted target voltage to a memory cell by switching between two voltage regulators.

14. The method of claim 13, wherein sampling voltage drops across one or more circuit elements comprises sampling a voltage drop of a replica source follower by hardwiring a source terminal of the replica source follower to an inverting input of an operational amplifier.

15. The method of claim 14, wherein the target voltage comprises a voltage applied to a non-inverting input of the operational amplifier.

16. The method of claim 15, wherein adjusting the target voltage based on the voltage drops comprises increasing an output voltage of the operational amplifier.

17. The method of claim 13, wherein sampling voltage drops across one or more circuit elements comprises sampling a voltage drop of a replica source follower and one or more replica control circuit elements by hardwiring a terminal a final circuit element in the one or more replica control circuit elements to an inverting input of an operational amplifier.

18. The method of claim 13, wherein supplying an adjusted target voltage to a memory element based on the sampling comprises supplying the adjusted target voltage to the memory element in response to a control signal.

* * * * *